United States Patent [19]

Pumphrey

[11] Patent Number: 4,812,681
[45] Date of Patent: Mar. 14, 1989

[54] NMOS ANALOG VOLTAGE COMPARATOR

[75] Inventor: Edward G. Pumphrey, Colorado Springs, Colo.

[73] Assignee: Hewlett-Packard Company, Palo Alto, Calif.

[21] Appl. No.: 48,164

[22] Filed: May 11, 1987

[51] Int. Cl.[4] .............................................. H03K 5/24
[52] U.S. Cl. ..................................... 307/362; 307/501
[58] Field of Search ............... 307/350, 355, 362, 490, 307/494, 501, 497

[56] References Cited

U.S. PATENT DOCUMENTS

| | | | |
|---|---|---|---|
| 4,333,025 | 6/1982 | Domogalla | 307/362 |
| 4,427,903 | 1/1984 | Sugimoto | 307/497 |
| 4,603,267 | 7/1986 | Kowallek | 307/362 |

Primary Examiner—John Zazworsky
Attorney, Agent, or Firm—Karl E. Bring

[57] ABSTRACT

An NMOS analog voltage comparator is disclosed having two matching cascaded inverter-pairs. The comparator has fast response time, is not sensitive to temperature variations while operating, and operates independent of integrated circuit parameter variations encountered during circuit manufacture.

9 Claims, 1 Drawing Sheet

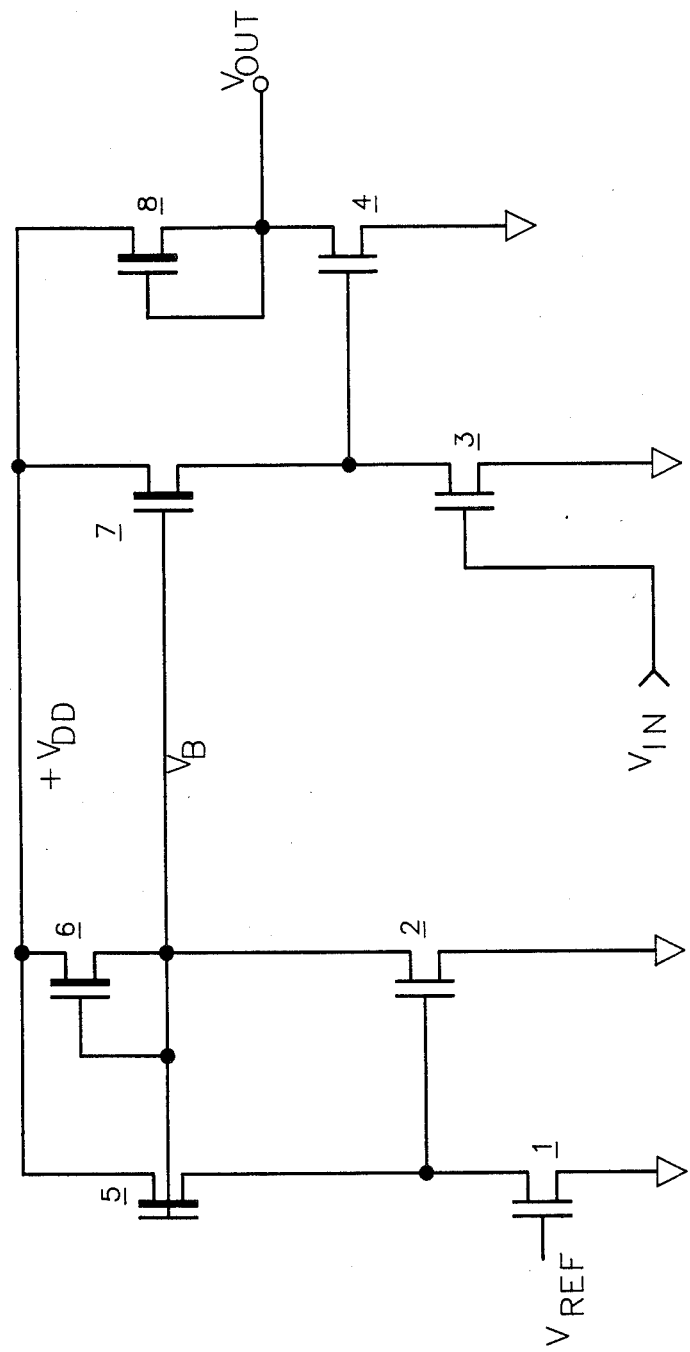

NMOS ANALOG VOLTAGE COMPARATOR

BACKGROUND OF THE INVENTION

The present invention relates to analog voltage comparators, and more specifically to analog voltage comparators suitable for use with NMOS circuitry.

NMOS circuitry has the characteristics of high speed and high circuit density, and therefore is useful for high speed digital applications. Analog voltage comparators, which compare two analog voltages, determine which voltage is greater, and provide a digital result, are useful in high speed digital applications. However, building analog voltage comparators suitable for use with NMOS technology has been difficult because the NMOS transistors have low gain and limited voltage range, and complementary PMOS transistors are not available. Prior art NMOS analog voltage comparators have been built using multi-stage differential amplifiers and complex level-shifting circuits which have resulted in slow response times. Also, these prior art comparators have required additional power sources. Consequently, prior art solutions have been inefficient and slow when used for analog comparisons.

SUMMARY OF THE INVENTION

In accordance with the illustrated preferred embodiment of the present invention, a cascaded pair of NMOS inverters provides a digital output in response to an analog input voltage according to a switching threshold voltage controlled by a second and matching cascaded pair of NMOS inverters according to a reference voltage input. The resulting output voltage is responsive to a relationship between the reference voltage and the input voltage and not dependent on the parameter variations from the NMOS batch or changes in temperature over a broad range of working conditions. The resultant NMOS voltage analog comparator is efficient, fast, and highly consistent in its operation.

BRIEF DESCRIPTION OF THE DRAWING

The FIGURE shows a schematic of the preferred embodiment of the present invention in which two matching cascaded inverter-pairs are used.

DETAILED DESCRIPTION OF THE PREFERRED EMBODIMENT

The FIGURE shows a schematic of the preferred embodiment of the present invention in which an analog comparator is comprised of two matching cascaded inverter-pairs. The first cascaded inverter pair is comprised of a first inverter, enhancement transistor 3 with a depletion transistor 7; and a second inverter, enhancement transistor 4 with a depletion transistor 8. The gate and source of transistor 8 are connected to the drain of transistor 4. The drain of transistor 8 is connected to a supply voltage $V_{DD}$ and the source of transistor 4 is connected to ground. This is a standard inverter.

The gate of transistor 4 is connected to the source of transistor 7 and the drain of transistor 3. The drain of transistor 7 is connected to the power supply $V_{DD}$. The source of transistor 3 is connected to ground. The analog input voltage $V_{IN}$ is applied to the gate of transistor 3, while the output is taken at the drain of transistor 4. The switching threshold of this inverter cascade is controlled by the voltage $V_B$ at the gate of transistor 7, and is made equal to a reference input voltage VREF by the action of the remaining components of the circuit.

The second cascaded inverter pair controls the voltage $V_B$ and therefore regulates the switching threshold of the first cascaded inverter pair. The second cascaded inverter pair comprises a third inverter, enhancement transistor 2 and depletion transistor 6; and a fourth inverter, enhancement transistor 1 and depletion transistor 5. The gate and source of transistor 6 are connected to the drain of transistor 2. The drain of transistor 6 is connected to the supply voltage $V_{DD}$. The source of transistor 2 is connected to ground. The source of transistor 5 is connected to the drain of transistor 1 and to the gate of transistor 2. The drain of transistor 5 is connected to the supply voltage $V_{DD}$. The source of transistor 1 is connected to ground. The voltage VREF is applied to the gate of transistor 1. The output voltage $V_B$ is connected to the gate of transistor 5.

The connection of the gate of transistor 5 to the output of the third inverter is a feedback connection. If the devices are properly dimensioned, as is well known in the prior art, the feedback will adjust the current in transistor 5 such that the fourth inverter will be biased into its "linear", or switching region, causing the output voltage $V_B$ to be approximately midway between the supply voltage $V_{DD}$ and ground.

The voltage $V_B$ is also applied to the gate of transistor 7, which is identical to transistor 5. Also, transistor 3 is identical to transistor 1, transistor 4 is identical to transistor 2, and transistor 8 is identical to transistor 6. Because of the symmetry, when input voltage $V_{IN}$ equals reference voltage VREF, then output voltage VOUT equals output voltage $V_B$, and the comparator output inverter, made up of transistors 4 and 8 will therefore be biased into its "linear", or switching region also. Therefore, the comparator output VOUT will change states when the input voltage $V_{IN}$ equals the reference voltage VREF.

Due to the feedback in the third and fourth inverters, the circuit automatically compensates for component parameter variations caused by process or temperature changes. Proper functioning of the circuit depends only on the close matching of parameters in the paired transistors, which is readily achieved within an integrated circuit.

In addition, the signal delay in the preferred embodiment is very small because the signal path consists of only the first and second inverters.

I claim:
1. An NMOS comparator circuit comprising:
   a first comparator having a first comparator first input, a first comparator second input, and a first comparator output wherein the first comparator first input is connected to the first comparator output and the first comparator second input is connectable to a reference voltage signal;
   a second comparator having a second comparator first input, a second comparator second input, and a second comparator output wherein the second comparator first input is connected to the first comparator output, and the second comparator second input is connectable to an input reference voltage; whereby the output provides a digital voltage resulting from a comparison of the input voltage signal to the reference voltage signal; and
   wherein each comparator is a cascaded inverter-pair.
2. An NMOS comparator circuit comprising:

a first comparator having a first comparator first input, a first comparator second input, and a first comparator output wherein the first comparator first input is connected to the first comparator output and the first comparator second input is connectable to a reference voltage signal;

a second comparator having a second comparator first input, a second comparator second input, and a second comparator output wherein the second comparator first input is connected to the first comparator output, and the second comparator second input is connectable to an input reference voltage; whereby the output provides a digital voltage resulting from a comparison of the input voltage signal to the reference voltage signal; and wherein each comparator comprises:

a first inverter having a first inverter first input, a first inverter second input and a first inverter output wherein the first inverter first input is the comparator first input, and the first inverter second input is the comparator second input; and a second inverter having a second inverter first input, a second inverter second input, and a second inverter output wherein the second inverter first input is connected to the second inverter output, the second inverter second input is connected to the first inverter output, and the second inverter output is the comparator output.

3. An NMOS comparator circuit as in claim 2 wherein each inverter comprises:

a depletion transistor having a drain, a gate, and a source wherein the drain is connected to a voltage supply, the gate is the inverter first input, and the source is the inverter output; and an enhancement transistor having a drain, a gate and a source wherein the drain is connected to the depletion transistor source, the gate is the inverter second input, and the source is grounded.

4. An NMOS comparator circuit as in claim 3 wherein all enhancement transistors have substantially similar operating characteristics, and all depletion transistors have substantially similar operating characteristics.

5. An NMOS comparator circuit comprising:

a first inverter having a first inverter first input, a first inverter second input, and a first inverter output wherein the first inverter second input is connectable to a reference voltage signal;

a second inverter having a second inverter first input, a second inverter second input, and a second inverter output wherein the second inverter first input is connected to the second inverter output, the second inverter second input is connected to the first inverter output, and the second inverter output is connected to the first inverter first input;

a third inverter having a third inverter first input, a third inverter second input, and a third inverter output wherein the third inverter first input is connected to second inverter output, and the third inverter second input is connectable to an input voltage signal;

a fourth inverter having a fourth inverter first input, a fourth inverter second input, and a fourth inverter output wherein the fourth inverter first input is connected to the fourth inverter output and the fourth inverter second input is connected to the third inverter output; whereby the fourth inverter output provides a digital voltage signal resulting from a comparison of the input voltage signal to the reference voltage signal.

6. An NMOS comparator circuit as in claim 5 wherein each inverter comprises:

a depletion transistor having a drain, a gate, and a source wherein the drain is connected to a voltage supply, the gate is the inverter first input, and the source is the inverter output; and an enhancement transistor having a drain, a gate and a source wherein the drain is connected to the depletion transistor source, the gate is the inverter second input, and the source is grounded.

7. An NMOS comparator circuit as in claim 6 wherein all enhancement transistors have substantially similar operating characteristics, and all depletion transistors have substantially similar operating characteristics.

8. An NMOS comparator circuit comprising:

a first enhancement transistor having a drain, a gate, and a source wherein the source is grounded, and the gate is connectable to a reference voltage signal;

a first depletion transistor having a drain, a gate, and a source wherein the source is connected to the first enhancement transistor drain, and the drain is connected to a voltage supply;

a second enhancement transistor having a drain, a gate, and a source wherein the source is grounded, the gate is connected to the first enhancement transistor drain, and the drain is connected to the first depletion transistor gate;

a second depletion transistor having a drain, a gate, and a source wherein the drain is connected to the voltage supply, and the gate and the source are connected to the second enhancement transistor drain;

a third enhancement transistor having a drain, a gate, and a source wherein the source is grounded, and the gate is connectable to receive an input voltage signal;

a third depletion transistor having a drain, a gate, and a source wherein the drain is connected to the voltage supply, the gate is connected to the second depletion transistor source, and the source is connected to the third enhancement transistor drain;

a fourth enhancement transistor having a drain, a gate, and a source wherein the source is grounded, and the gate is connected to the third enhancement transistor drain;

a fourth depletion transistor having a drain, a gate, and a source wherein the drain is connected to the voltage supply, the gate and the source are connected to the fourth enhancement transistor drain; whereby the input voltage signal is compared to the reference voltage signal resulting in a digital voltage output at the fourth enhancement transistor drain.

9. An NMOS comparator circuit as in claim 8 wherein all enhancement transistors have substantially similar operating characteristics, and all depletion transistors have substantially similar operating characteristics.

* * * * *